United States Patent
Wakabayashi et al.

(10) Patent No.: US 10,763,127 B2
(45) Date of Patent: Sep. 1, 2020

(54) HEAT TREATMENT METHOD FOR SEMICONDUCTOR WAFER

(71) Applicant: SHIN-ETSU HANDOTAI CO., LTD., Tokyo (JP)

(72) Inventors: Taishi Wakabayashi, Nagano (JP); Miho Niitani, Nagano (JP); Kenji Meguro, Nagano (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 16/072,541

(22) PCT Filed: Jan. 26, 2017

(86) PCT No.: PCT/JP2017/002618
§ 371 (c)(1),
(2) Date: Jul. 25, 2018

(87) PCT Pub. No.: WO2017/141652
PCT Pub. Date: Aug. 24, 2017

(65) Prior Publication Data
US 2019/0035639 A1    Jan. 31, 2019

(30) Foreign Application Priority Data
Feb. 19, 2016   (JP) .................................. 2016-029815

(51) Int. Cl.
*H01L 21/687* (2006.01)
*H01L 21/324* (2006.01)
(Continued)

(52) U.S. Cl.
CPC ........ *H01L 21/324* (2013.01); *H01L 21/2686* (2013.01); *H01L 21/67115* (2013.01); *H01L 21/68742* (2013.01)

(58) Field of Classification Search
None
See application file for complete search history.

(56) References Cited

U.S. PATENT DOCUMENTS

| 5,374,564 A | 12/1994 | Bruel |
| 2002/0061660 A1* | 5/2002 | Ito .................... H01L 21/3226 438/795 |

(Continued)

FOREIGN PATENT DOCUMENTS

| JP | H05-211128 A | 8/1993 |
| JP | H11-097431 A | 4/1999 |

(Continued)

OTHER PUBLICATIONS

Aug. 21, 2018 International Preliminary Report on Patentability issued in International Patent Application No. PCT/JP2017/002618.
(Continued)

*Primary Examiner* — Ali Naraghi
(74) *Attorney, Agent, or Firm* — Oliff PLC

(57) ABSTRACT

A heat treatment method for a semiconductor wafer includes: heat treatment in a heat treatment furnace of single wafer processing type having a susceptor capable of mounting a semiconductor wafer, the heat treatment being performed on a semiconductor wafer mounted on the susceptor disposed in the heat treatment furnace; and pre-heating to hold the temperature in the heat treatment furnace at a prescribed temperature lower than the temperature of the heat treatment for a prescribed period before the heat treatment, holding the semiconductor wafer separated from the susceptor during the pre-heating. This heat treatment method for a semiconductor wafer makes it possible to reduce the slip of a semiconductor wafer without largely lowering the productivity even in a high-temperature heat treatment.

4 Claims, 4 Drawing Sheets

(51) Int. Cl.
    *H01L 21/268*    (2006.01)
    *H01L 21/67*     (2006.01)

(56) References Cited

U.S. PATENT DOCUMENTS

| | | | |
|---|---|---|---|
| 2002/0187649 A1* | 12/2002 | Nakamura | H01L 21/3185 |
| | | | 438/758 |
| 2003/0127124 A1* | 7/2003 | Jones | H01L 31/188 |
| | | | 136/244 |
| 2003/0133773 A1* | 7/2003 | Wang | H01L 21/67184 |
| | | | 414/217 |
| 2003/0181001 A1 | 9/2003 | Aga et al. | |
| 2006/0201413 A1 | 9/2006 | Nishizawa | |
| 2008/0142497 A1 | 6/2008 | Sorabji et al. | |
| 2016/0099166 A1* | 4/2016 | Yudovsky | H01L 21/68785 |
| | | | 29/559 |

FOREIGN PATENT DOCUMENTS

| | | |
|---|---|---|
| JP | 2002-217183 A | 8/2002 |
| JP | 2005-085993 A | 3/2005 |
| JP | 2008-166706 A | 7/2008 |
| JP | 2014-175637 A | 9/2014 |
| WO | 03/009386 A1 | 1/2003 |
| WO | 2005/001916 A1 | 1/2005 |

OTHER PUBLICATIONS

Mar. 7, 2017 International Search Report issued in International Patent Application No. PCT/JP2017/002618.
Nov. 27, 2018 Office Action issued in Japanese Patent Application No. 2016-029815.

* cited by examiner

HEAT TREATMENT METHOD FOR SEMICONDUCTOR WAFER

TECHNICAL FIELD

The present invention relates to a heat treatment method for a semiconductor wafer.

BACKGROUND ART

A method of delaminating ions-implanted wafers after bonding to manufacture SOI wafers, i.e., an ion implantation delamination method (a technique also referred to as the Smart Cut method (registered trademark)), has attracted attention as a method of manufacturing silicon on insulator (SOI) wafers, for example, particularly a method of manufacturing thin-SOI wafers that enable improvement in performance of advanced integrated circuits. This ion implantation delamination method is a technique to form an SOI wafer (See Patent Document 1) in the following manner: an oxide film is formed on at least one of two silicon wafers; gas ions such as hydrogen ions or rare gas ions are implanted from a front surface of one of the silicon wafers (a bond wafer) to form a micro bubble layer (also referred to as an enclosed layer or an ion implanted layer) in the interior of the wafer; the surface from which the ions are implanted is then brought into close contact with the other silicon wafer (a base wafer) through the oxide film; a heat treatment (a delamination heat treatment) is then performed to cleave one of the wafers (the bond wafer) along the micro bubble layer so that the bond wafer is delaminated into a thin film; and another heat treatment (a bonding heat treatment) is then performed in accordance with needs to strengthen a bond between the wafers. At this point, the cleavage plane (the delaminating plane) is a surface of an SOI layer and an SOI wafer having a thin SOI with high uniformity is relatively readily obtained.

The SOI wafer after the delamination, however, has a damage layer on its surface due to the ion implantation. This surface is rougher than a surface of a normal mirror-polished silicon wafer. The ion implantation delamination method accordingly needs to remove such a damage layer and surface roughness.

Conventionally, mirror polishing with extremely small polishing stock removal (a stock removal of about 100 nm or more), referred to as touch polishing, is performed to remove the damaged layer and so on in the final step after the bonding heat treatment. Even though the implantation of ions such as hydrogen ions and the delamination can achieve the radial uniformity of the thickness of the SOI layer (radial film thickness distribution) to a certain extent, a polishing process including such a mechanical factor performed on the SOI layer degrades this uniformity because of nonuniform polishing stock removal. Specifically, when a bonded SOI wafer is manufactured by an ion implantation delamination method using a silicon single crystal wafer with the diameter of 300 mm, for example, and flattening and removal of a damage are performed on the surface of the delaminated SOI layer only by touch polishing, the radial film thickness uniformity is inevitably degraded to ±6 nm or more after the touch polishing even when it has been ±1 nm in the SOI layer just after the delamination.

To solve this problem, a flattening process including a high-temperature heat treatment is recently performed to improve the surface roughness, instead of the touch polishing. For example, Patent Document 2 describes decreasing a film thickness of a thin film of a bonded wafer after delaminating the bond wafer by heat treatment under an atmosphere of inert gas, hydrogen gas, or mixed gas thereof, followed by thermal oxidation to form a thermal oxide film on the surface of the thin film, and removing the thermal oxide film (i.e., sacrificial oxidation process).

Another method is also described, in which a delaminated bonded wafer is subjected to heat treatment under an atmosphere of inert gas, hydrogen gas, or mixed gas thereof, followed by polishing of the surface of the thin film with a stock removal of 70 nm or less, and then a sacrificial oxidation process is performed to reduce the thickness of a thin film.

CITATION LIST

Patent Literature

Patent Document 1: Japanese Unexamined Patent Application Publication (Kokai) No. H05-211128
Patent Document 2: International Publication No. WO2003/009386
Patent Document 3: international. Publication No. WO2005/001916

SUMMARY OF INVENTION

Technical Problem

SOI wafers for radio frequency (RF) devices have been increasingly demanded to improve the quality in recent years. Particularly, SOI layers in device active regions (BOND layers) have been highly demanded to improve the film thickness uniformity. One of the methods to improve the film thickness uniformity includes a technique in which an SOI wafer is subjected to high-temperature heat treatment to improve the surface (flattening), followed by a polishing process as described above (Patent Document 2).

When a heat treatment of an SOI wafer is performed at higher temperature, however, there arises a problem that slip dislocations (hereinafter, simply described as slips) tends to occur. The slip tends to be actualized by a process of rapid temperature increase or a heat treatment at a higher temperature for a long period. As a countermeasure for the slip, it has been adapted a method to lighten the thermal stress due to heat shock such as reducing of temperature increase rate in a high-temperature heat treatment or moderating of temperature increase by dividing the temperature increase process into a plurality of steps. These methods, however, are not preferable because of a problem of longer heat treatment time, which largely lowers the productivity.

The present invention has been done in view of the above problems, and an object thereof is to provide a heat treatment method for a semiconductor wafer that makes it possible to reduce slips of a semiconductor wafer without largely lowering the productivity even in a high-temperature heat treatment.

Solution to Problem

To solve the above problems, the present invention provides a heat treatment method for a semiconductor wafer, comprising:

heat treatment in a heat treatment furnace of single wafer processing type having a susceptor capable of mounting a semiconductor wafer, the heat treatment being performed on a semiconductor wafer mounted on the susceptor disposed in the heat treatment furnace; and pre-heating to hold the temperature in the heat treatment furnace at a prescribed temperature lower than the temperature of the heat treatment for a prescribed holding period before the heat treatment, holding the semiconductor wafer separated from the susceptor during the pre-heating.

The heat treatment method for a semiconductor wafer like this makes it possible to reduce slips of a semiconductor wafer without largely lowering the productivity even in a high-temperature heat treatment.

It is preferable that the heat treatment furnace have a lift pin configured to move the semiconductor wafer upwardly and downwardly with respect to the susceptor, and the semiconductor wafer be separated from the susceptor by being supported by the lift pin.

The heat treatment method for a semiconductor wafer like this does not need an additional device for separation, and is convenient thereby.

The semiconductor wafer is preferably an SOI wafer.

The SOI wafer has already been subjected to heat treatment such as a delamination heat treatment and a bonding heat treatment at least once in the manufacturing step, and is susceptible to occurrence of slip dislocations (tends to cause slips) compared to ordinal semiconductor wafers (non-heat-treated wafers) thereby. Accordingly, the inventive heat treatment is particularly effective for SOI wafers.

It is preferable that the temperature of the heat treatment be 1100° C. or more, and the temperature of the pre-heating be 700° C. or more and less than 1100° C.

The heat treatment method for a semiconductor wafer like this makes it possible to further reduce slips of a semiconductor wafer while improving the surface of a semiconductor wafer.

The heat treatment is preferably performed in an atmosphere of hydrogen gas, argon gas, or a mixed gas thereof.

The heat treatment method for a semiconductor wafer like this makes it possible to perform a heat treatment for flattening the surface of a semiconductor wafer favorably.

The holding period in the pre-heating is preferably 10 seconds or more and 90 seconds or less.

The heat treatment method for a semiconductor wafer like this makes it possible to obtain sufficient throughput while keeping the effect of reducing slips.

Advantageous Effects of Invention

The inventive heat treatment method for a semiconductor wafer makes it possible to reduce slips of a semiconductor wafer without largely lowering the productivity even in a high-temperature heat treatment.

DESCRIPTION OF EMBODIMENTS

Figure 1:
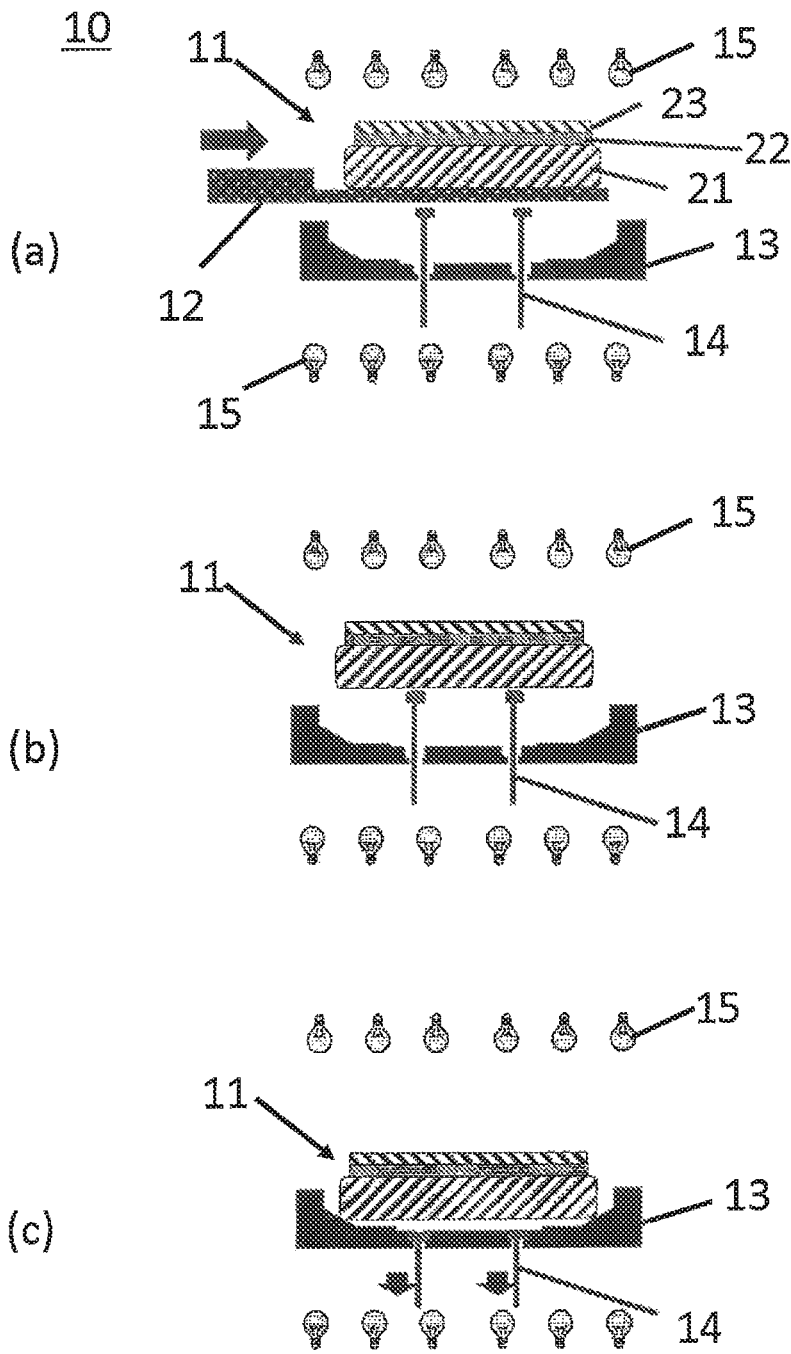
FIG. 1 is a flow diagram showing an example of the heat treatment method for a semiconductor wafer of the present invention.

Hereinafter, the present invention will be described more specifically.

As described above, it has been seeking a heat treatment method for a semiconductor wafer that makes it possible to reduce slips of a semiconductor wafer without largely lowering the productivity in heat treatment for a semiconductor wafer, particularly for an SOI wafer. This method involves a step of high-temperature heat treatment of a semiconductor wafer. The object of high-temperature heat treatment includes surface improvement (flattening) of a semiconductor wafer.

In heat treatment for a semiconductor wafer, particularly for an SOI wafer, the slips have been reduced by a method to lighten the thermal stress due to heat shock such as reducing of temperature increase rate in a high-temperature heat treatment or moderating of temperature increase by dividing the temperature increase process into a plurality of steps. These methods, however, have a problem of longer heat treatment time to lower the productivity. Accordingly, the present invention intends to provide a heat treatment method for a semiconductor wafer that makes it possible to reduce slips of a semiconductor wafer, an SOI wafer in particular, without largely lowering the productivity even in a high-temperature heat treatment.

First, the inventors have investigated the mechanism of causing slips in heat treatment of an SOI wafer to find the following information. The susceptor that has been preciously disposed in a heat treatment furnace is heated to a higher temperature. Accordingly, when a wafer is transferred from outside of the heat treatment furnace to be mounted on this susceptor, the wafer causes to thermal deformation due to the temperature difference between the wafer and the susceptor, thereby causing a scratch on the periphery of the wafer, which is in contact with the susceptor. The scratch becomes a starting point of slip to make the wafer liable to cause slips in the heat treatment. Then, the present invention is designed to perform pre-heating on a wafer held in midair in a heat treatment furnace by a lift pin, for example, before mounting the wafer on a susceptor, and to perform high-temperature heat treatment of the wafer on the susceptor after reducing the temperature difference between the wafer and the susceptor. As a result, it has become possible to manufacture an SOI wafer in which slips are reduced without largely lowering the productivity.

It is to be noted that Patent Document 3 describes a hydrogen heat treatment in which a wafer is supported on a lift pin (separated from a susceptor) before epitaxial growth. Patent Document 3, however, discloses a method for manufacturing a silicon epitaxial wafer, and the object of Patent Document 3 is lowering of the unevenness of the back surface in epitaxial growth, that is, solving the problem due to coexisting film growth. Accordingly, Patent Document 3 does not describe nor suggests treatments except for epitaxial growth, for example, a heat treatment without film growth like in the present invention, particularly an operation of separating a wafer from susceptor before the heat treatment for flattening the delaminating plane of a semiconductor wafer.

Hereinafter, the embodiments of the present invention will be specifically described by reference to FIGS, but the present invention is not limited thereto.

First, a heat treatment furnace of single wafer processing type usable for the inventive heat treatment method for a semiconductor wafer will be described by referring to FIG. 1(a). In a heat treatment furnace 10 of single wafer processing type includes a transfer blade 12 that is capable of introducing (transferring) a semiconductor wafer 11 into the heat treatment furnace, a susceptor 13 capable of mounting the semiconductor wafer 11, a lift pin(s) 14 configured to move the semiconductor wafer 11 upwardly and downwardly with respect to the susceptor 13, and a lamp 15 capable of heat treatment of the semiconductor wafer 11, each disposed in the heat treatment furnace. It is to be noted that FIG. 1(a) illustrates the case in which the semiconductor wafer 11 is an SOI wafer including a buried insulator film layer 22 and an SOI layer 23 formed on a base wafer 21.

As the heat treatment furnace 10 of single wafer processing type, it is possible to use a heat treatment furnace with lamp heating method of single wafer processing type capable of rapid thermal annealing (RTA) processing, in which rapid temperature increase, temperature holding at a higher temperature, and rapid temperature decrease were performed.

Subsequently, a heat treatment method for an SOI wafer will be described by referring FIGS. 1(a) to (c) as an example of the inventive heat treatment method for a semiconductor wafer, but the present invention is not limited thereto. The present invention intends to reduce slip dislocations caused by heat treatment to flatten a delaminating plane of an SOI wafer (e.g., a high-temperature heat treatment, at 1100° C. or more) as one of the object. The present invention is, however, also applicable to heat treatments for semiconductor wafers such as ordinal silicon single crystal wafers (e.g., a high-temperature heat treatment to annihilate defects of the surface), not only to SOI wafers.

The SOI wafer, which is one of the object of the inventive heat treatment, has already been subjected to heat treatment such as a delamination heat treatment and a bonding heat treatment at least once in the manufacturing step, and is susceptible to occurrence of slip dislocations (tends to cause slips) compared to ordinal semiconductor wafers (non-heat-treated wafers) thereby. Accordingly, the inventive heat treatment is particularly effective for SOI wafers.

First, an SOT wafer 11 is introduced into the heat treatment furnace 10 of single wafer processing type by using the transfer blade 12 (FIG. 1(a)). At this time, the lift pin 14 has been raised with respect to the susceptor 13. This makes it possible to hold the SOI wafer 11 separated from the susceptor 13 when the SOI wafer 11 is unloaded from the transfer blade 12 to be mounted on the lift pin 14. It is to be noted that the method for holding the SOT wafer 11 separated from the susceptor 13 is not limited to the method in which the SOI wafer 11 is supported by the lift pin 14, but this method is convenient since it does not need an additional device for separation.

In introducing the SOI wafer 11, the atmosphere in the heat treatment furnace 10 is not particularly limited, but can be an atmosphere of hydrogen gas, argon gas, or a mixed gas thereof, for example.

In introducing the 801 wafer 11, the temperature in the heat treatment furnace is not particularly limited, but can be 700° C. or more and less than 1100° C.

Then, prior to the heat treatment (FIG. 1(c)) described below, pre-heating is performed to keep the temperature in the heat treatment furnace 10 at a prescribed temperature lower than the temperature of the heat treatment, which will be described later, for a prescribed holding period (FIG. 1(b)). In the present invention, the SOI wafer 11 is held while being separated from the susceptor 13 during this pre-heating.

The pre-heating can be performed with a lamp 15, for example. As the lamp 15, a halogen lamp can be used, for example.

The pre-heating can be performed in an atmosphere of hydrogen gas, argon gas, or a mixed gas thereof, for example.

The holding temperature of the pre-heating is not particularly limited, but is preferably 700° C. or more and less than 1100° C. When the temperature of the pre-heating is 700° C. or more, the temperature difference can be smaller enough between the semiconductor wafer 11 and the susceptor 13. Since the temperature of the heat treatment (higher holding temperature) described below is preferably 1100° C. or more, the temperature of pre-heating is preferably less than 1100° C.

The holding period in the pre-heating is not particularly limited, but is preferably 10 seconds or more and 90 seconds or less. The holding period of 10 seconds or more in the pre-heating gives sufficient effect for reducing slips. The holding period of 90 seconds or less in the pre-heating gives sufficient throughput.

Then, the heat treatment is performed on the SOI wafer 11 after the pre-heating (FIG. 1(c)). In the heat treatment, the SOI wafer 11 is mounted on the susceptor 13 by lowering the lift pin 14 with respect to the susceptor 13, for example.

The heat treatment can be performed with a lamp 15, for example. That is, the heating means in the heat treatment can be the same as the heating means in the pre-heating.

The heat treatment is preferably performed in an atmosphere of hydrogen gas, argon gas, or a mixed gas thereof. As described above, the atmosphere in the heat treatment can be the same as the atmosphere in the pre-heating. This makes it possible to perform a heat treatment to flatten the surface of the semiconductor wafer 11. Particularly, it becomes possible to perform a heat treatment to flatten the surface of a delaminated SOI water produced by an ion implantation delamination method.

The heat treatment can be performed by an RTA treatment. This makes it possible to improve the surface of an SOI wafer more sufficiently.

The temperature of the heat treatment (higher holding temperature) is not particularly limited, but is preferably 1100° C. or more. When the temperature of the heat treatment is 1100° C. or more, it is possible to improve the surface of a semiconductor wafer, particularly of an SOI wafer more sufficiently. The upper limit temperature of the heat treatment is not particularly limited, but can be 1350° C., for example.

The period of the heat treatment (high-temperature holding time) is not particularly limited, and can be 1 second or more and 300 seconds or less, for example.

In the heat treatment, the increase rate of the temperature and the decrease rate of the temperature are not particularly limited, but can be 10° C./second or more and 50° C./second, or less, for example.

Subsequently, the case in which the inventive heat treatment method for a semiconductor wafer is applied to a method for manufacturing an SOI wafer will be described by referring FIG. 2. In this instance, formation of an insulator film is performed only on a bond wafer. When the present invention is applied to manufacturing of an SOI wafer, that is, when a heat treatment method for an SOI wafer involves a process of pre-heating a wafer that is held in midair in a heat treatment furnace by using a lift pin and so on before the heat treatment on the susceptor, it is possible to manufacture an SOI wafer with reduced slips and high productivity.

Figure 2:
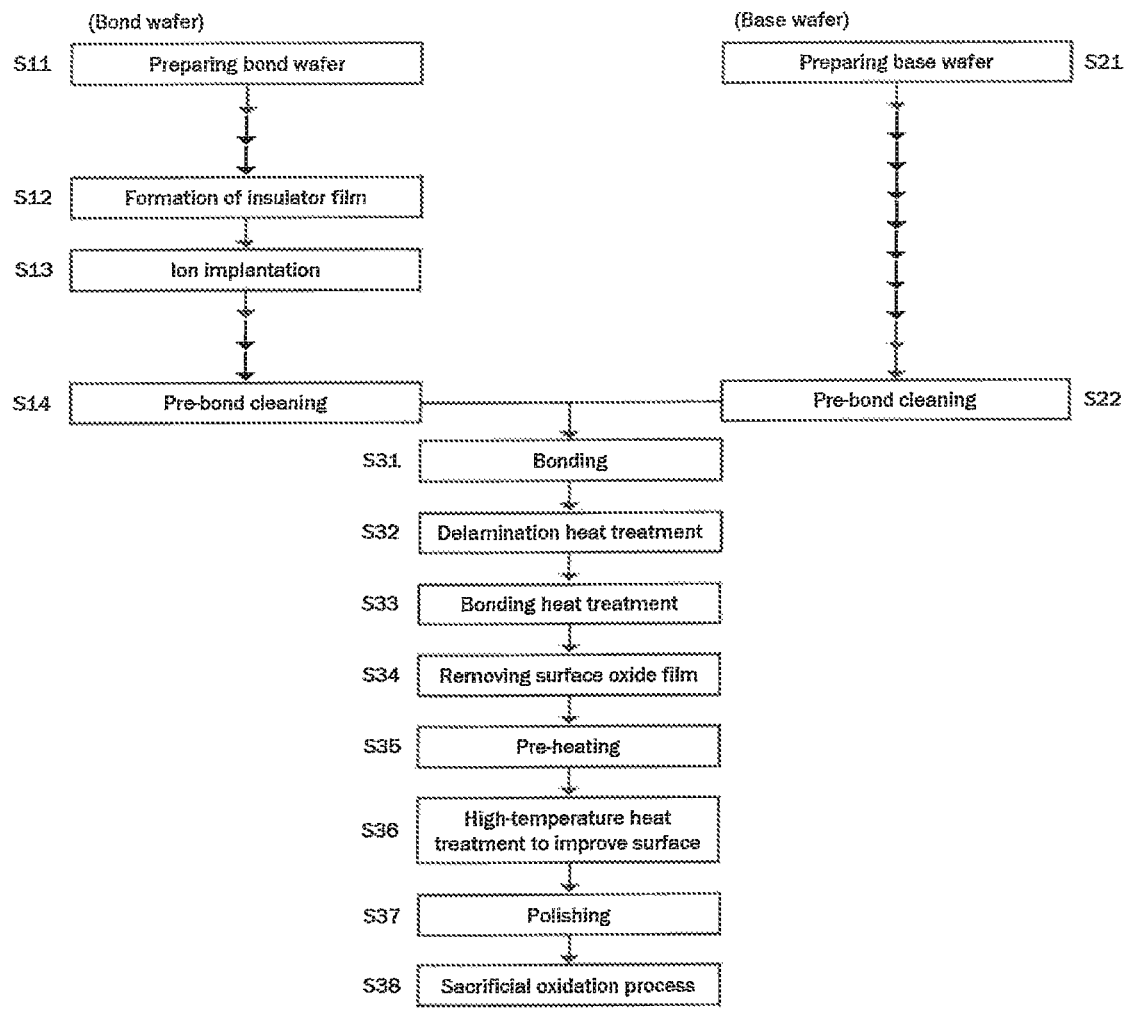
FIG. 2 is a flow diagram showing an example of the method for manufacturing an SOI wafer involving the inventive heat treatment method for a semiconductor wafer applied thereto.

At first, a bond wafer is prepared (S11 in FIG. 2). The bond wafer can be a silicon single crystal wafer.

Then, on the bond wafer, an insulator film (e.g., an oxide film) is grown, which becomes a buried insulator layer (also referred to as a BOX layer in case of a buried oxide film) (S12 in FIG. 2).

Next, at least one gas ion of a hydrogen ion and a rare gas ion is implanted from above the insulation film with an ion implanter to form an ion implantation layer in the bond wafer (S13 in FIG. 2). At this stage, the ion implantation acceleration voltage is selected so as to obtain an intended thickness of the SOI layer.

Subsequently, pre-bond cleaning is performed so as to remove particles on the bonding surface of the bond wafer (S14 in FIG. 2).

On the other hand, a base wafer is prepared (S21 in FIG. 2) separately from the above. The base wafer can be a silicon single crystal wafer.

Then, pre-bonding cleaning is performed so as to remove particles on the surface of the base wafer (S22 in FIG. 2). It is to be noted that S11 to S14 in FIG. 2 and S21 to S22 in FIG. 2 can be proceeded in parallel with each other.

Next, the base wafer is brought into close contact with the bond wafer on which the insulator film is formed to be adhered thereto such that the base wafer is in contact with the ion implantation surface of the bond wafer (S31 in FIG. 2).

Subsequently, the bonded wafer is subjected to a heat treatment to form a micro bubble layer in the ion implantation layer (delamination heat treatment), and cleaved along the formed micro bubble layer to produce a bonded wafer in which the buried insulator film and the SOI layer are formed on the base wafer (S32 in FIG. 2).

Then, the bonded wafer is subjected to a bonding heat treatment to increase the bonding strength on the bonding interface (S33 in FIG. 2).

Next, an oxide film on the surface of the bonded wafer, formed by the bonding heat treatment, is removed (S34 in FIG. 2). It is possible to produce an SOI wafer as described above.

Subsequently, the SOI wafer is subjected to pre-heating and a heat treatment high-temperature heat treatment to improve the surface) to flatten the delaminating plane of the SOI wafer (S35 and S36 in FIG. 2). The specifics of this process is as described above.

Then, the SOI wafer after the heat treatment is polished (S37 in FIG. 2). Since the polishing is performed after the high-temperature heat treatment, the polishing removal can be reduced compared to the case of flattening performed only by polishing.

Next, the SOI wafer after the polishing is subjected to a sacrificial oxidation treatment to thin the thickness of the SOI layer (S38 in FIG. 2). The thickness of the SOI layer is thinned by thermal oxidation of the surface of the SOI layer by an oxidation heat treatment using a batch type of vertical furnace to form an oxide film, and removing the oxide film with an aqueous solution containing HF, for example.

An SOI wafer can be manufactured in such a manner described above.

EXAMPLES

Hereinafter, the present invention will be specifically described by showing Examples and Comparative Examples, but the present invention is not limited to the following Examples.

Example 1

Figure 3:
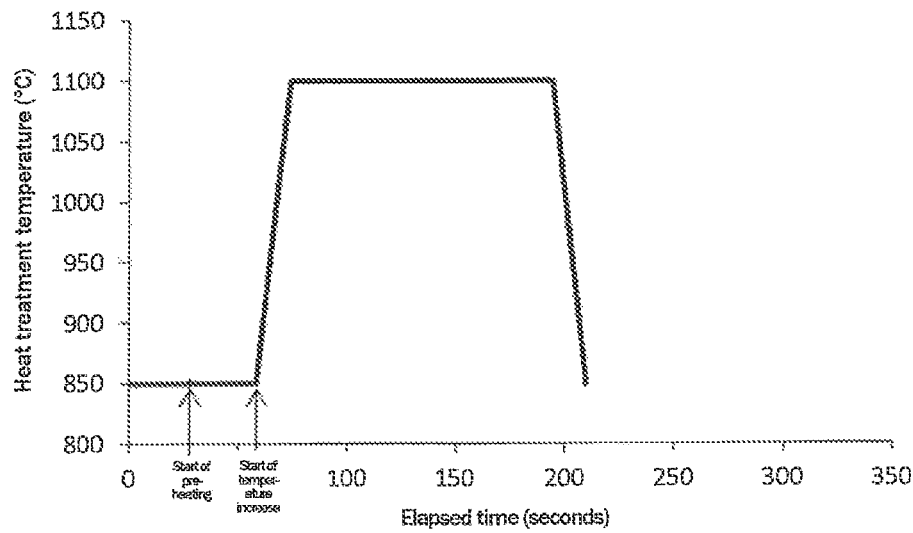
FIG. 3 is a graph showing a temperature profile in Example 1.
Figure 4:
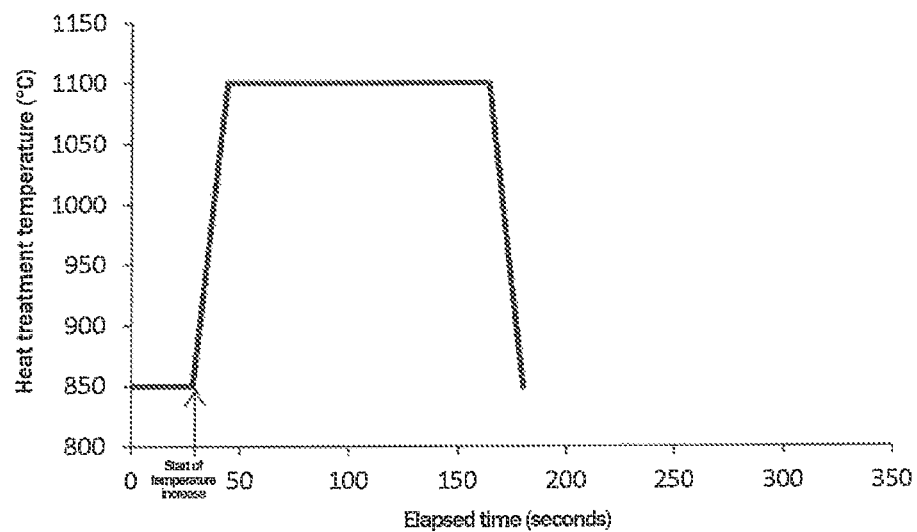
FIG. 4 is a graph showing a temperature profile in Comparative Example 1.
Figure 5:
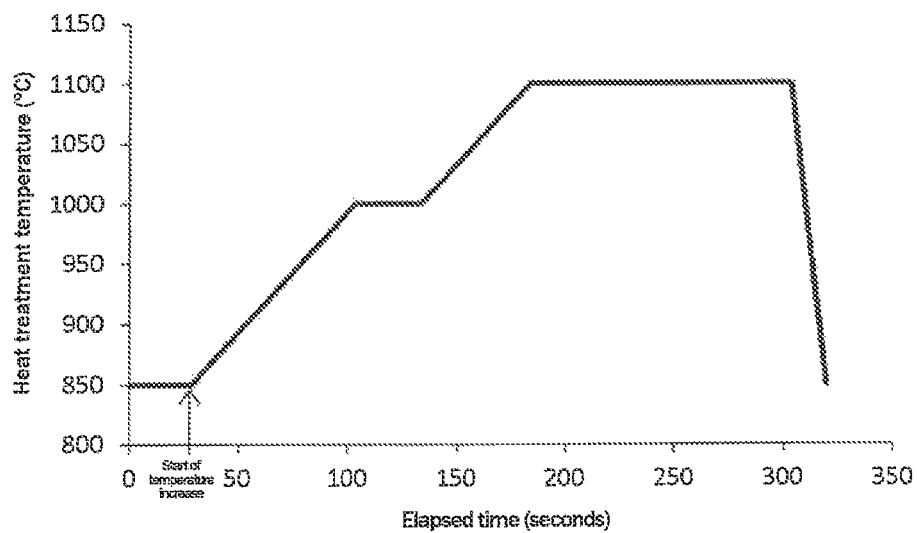
FIG. 5 is a graph showing a temperature profile in Comparative Example 2.
Figure 6:
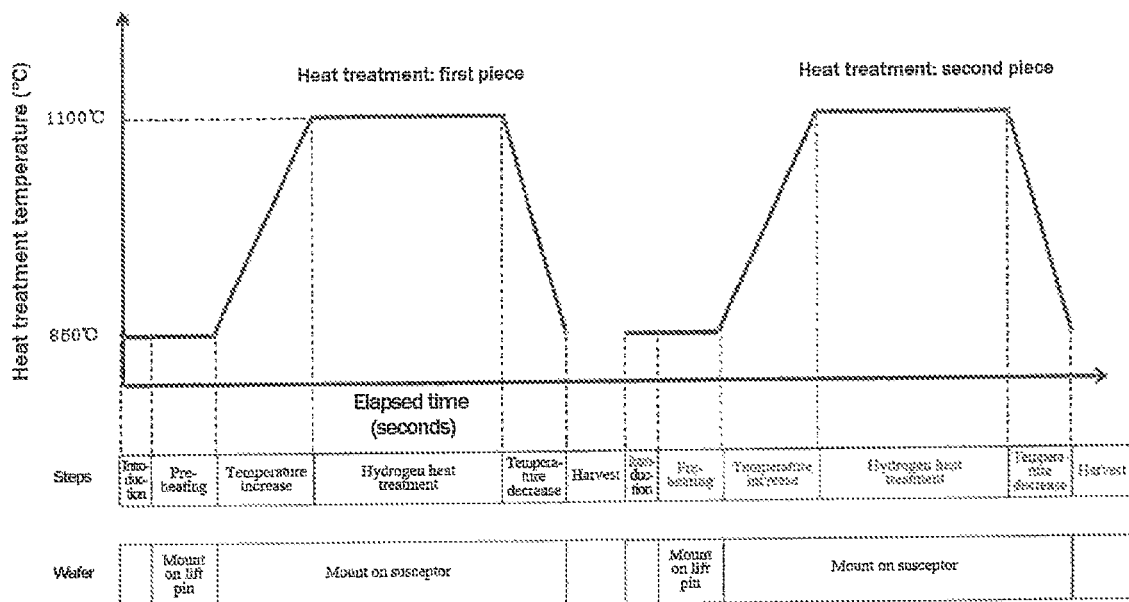
FIG. 6 is a diagram showing relations among the temperature profile, the details of steps at each temperature, and the position of an SOI wafer at each temperature in Example 1.

Pre-heating and a heat treatment were performed on an SOI wafer shown in Table 1 described below in a temperature profile (recipe time chart) shown in Table 1 and FIG. 3 described below. In FIG. 3, the vertical axis represents the heat treatment temperature (° C.) and the horizontal axis represents the elapsed time (recipe elapsed time) (seconds). The relations among the temperature profile, details of steps at each temperature, and the position of the SOI wafer at each temperature in Example 1 are as shown in FIG. 6. It is to be noted that FIG. 6 shows a temperature profile when two pieces of SOI wafers were heat treated continuously. Incidentally, each cycle time shown in Table 1 is a time from the time at which the SOI wafer was introduced to the time at which the rapid temperature decrease was finished as shown in FIGS. 3 to 6.

Specifically, the SOI wafer was introduced into a heat treatment furnace of single wafer processing type with the furnace temperature of 850° C. at first. (FIG. 1(a)). Then, pre-heating was performed under the conditions of ordinal pressure, in an atmosphere of 100% hydrogen, and at 850° C. for 30 seconds while the SOI wafer being mounted on a lift pin. (i.e., the SOI wafer being separated from a susceptor) (FIG. 1(b)). Subsequently, the lift pin was lowered with respect to the susceptor to mount the SOI wafer to the susceptor. Next, the temperature was increased to 1100° C. at an increase rate of the temperature of 15° C./second. Then, a heat treatment was performed under the conditions of ordinal pressure, in an atmosphere of 100% hydrogen, and at a holding temperature of 1100° C. for a high-temperature holding time of 120 seconds (FIG. 1(c)). Subsequently, the temperature was decreased to 850° C. at a decrease rate of the temperature of 15° C./second.

Comparative Example 1

A heat treatment was performed on an SOI wafer shown in Table 1 described below in a temperature profile shown in Table 1 and FIG. 4 described below. Specifically, the heat treatment was performed under the same conditions as in Example 1 except that pre-heating was not performed. That is, the SOI wafer was introduced into a heat treatment furnace of single wafer processing type with the furnace temperature of 850° C. at first to mount the SOI wafer on a susceptor. Then, the temperature was increased to 1100° C. at an increase rate of the temperature of 15° C./second. Subsequently, a heat treatment was performed under the conditions of ordinal pressure, in an atmosphere of 100% hydrogen, and at a holding temperature of 1100° C. for a high-temperature holding time of 120 seconds. Next, the temperature was decreased to 850° C. at a decrease rate of the temperature of 15° C./second.

Comparative Example 2

A heat treatment was performed on an SOI wafer shown in Table 1 described below in a temperature profile shown in Table 1 and FIG. 5 described below. Specifically, the SOI wafer was introduced into a heat treatment furnace of single wafer processing type with the furnace temperature of 850° C. at first to mount the SOI wafer on a susceptor. Then, the temperature was increased through a temperature increase process divided into two stages. Specifically, the temperature was increased to 1000° C. at an increase rate of the temperature of 2° C./second, followed by keeping at 1000° C. for 30 seconds, and thereafter, the temperature was increased to 1100° C. at an increase rate of the temperature of 2° C. second. After this temperature increase, a heat treatment was performed under the conditions of ordinal pressure, in an atmosphere of 100% hydrogen, and at a holding temperature of 1100° C. for a high-temperature holding time of 120 seconds. Next, the temperature was decreased to 850° C. at a decrease rate of the temperature of 15° C./second.

Figure 7:
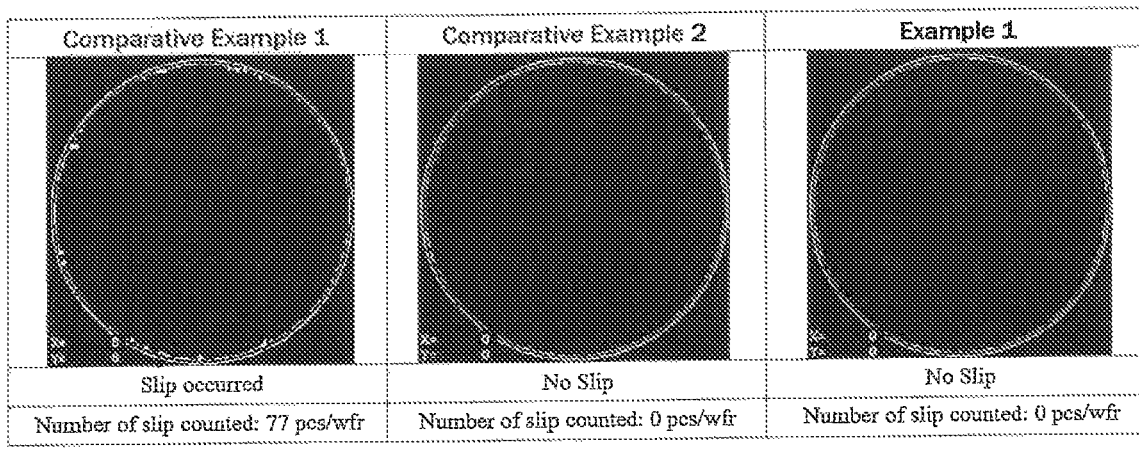
FIG. 7 is a diagram showing results of surface inspection for SOI wafers after heat treatment in Example 1, Comparative Example 1, and Comparative Example 2 measured with a laser surface inspection apparatus.

The results of Example 1, Comparative Example 1, and Comparative Example 2 are shown in Table 1 and FIG. 7. Incidentally, FIG. 7 is a diagram showing results of surface inspection for SOI wafers after heat treatment in Example 1, Comparative Example 1, and Comparative Example 2 measured with a laser surface inspection apparatus.

TABLE 1

| | | Comparative Example 1 | Comparative Example 2 | Example 1 |
|---|---|---|---|---|
| SOI wafer | | \multicolumn{3}{c}{Diameter: 200 mm, SOI layer: 300 nm, resistance: 45 Ωcm, N-type, crystal orientation: <100> BOX layer: 300 nm, Base wafer: 725 μm, resistance: 12.5 Ωcm, N-type, crystal orientation: <100>} | | |
| Existence or non-existence of pre-heating | | None | None | Exist (850° C., 30 seconds) |
| Number of steps in temperature increase | | One stage | Two stages | One stage |
| Increase rate of temperature | | 15° C./second | First stage: 2° C./second Second stage: 2° C./second | 15° C./second |
| Conditions of heat treatment | Heat treatment temperature | | 1100° C. | |
| | Heat treatment time | | 120 seconds | |
| | Pressure | | Ordinal pressure | |
| Cycle time | | 180 | 319 | 210 |
| Relative value of cycle time (when the value in Comparative Example 1 is 1.00) | | 1.00 | 1.77 | 1.17 |
| Existence or non-existence of slip | | Exist | None | None |

As shown in Table 1 and FIG. 7, Example 1 did not cause a slip nor large lowering of the productivity (the cycle time was 1.17 times that in Comparative Example 1) even in a high-temperature heat treatment. On the other hand, Comparative Example 1, without performing pre-heating, caused slips around the periphery of the SOI wafer. Specifically, 77 slips were detected per a piece of the SOI wafer. Comparative Example 2, in which the temperature was gradually increased by reducing the increase rate of the temperature and dividing the process of temperature increase to a plurality of steps as a countermeasure for slip, caused large lowering of the productivity such that the cycle time was increased to 1.77 times that in Comparative Example 1 although it did not cause a slip.

Example 2

Pre-heating and a heat treatment were performed under the same conditions as in Example 1 except that the holding time in the pre-heating was 60 seconds. As a result, Example 2 also did not cause a slip in the SOI wafer. The productivity was successfully maintained such that the relative value of cycle time in Example 2 was 1.33 compared to that in Comparative Example 1.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A heat treatment method for a semiconductor wafer, comprising:
    heat treatment in a heat treatment furnace with lamp heating method of single wafer processing type having a susceptor capable of mounting the semiconductor wafer, the heat treatment being performed with lamp heating on a semiconductor wafer mounted on the susceptor disposed in the heat treatment furnace; and
    pre-heating with lamp heating to hold the temperature in the heat treatment furnace at a prescribed temperature lower than the temperature of the heat treatment for a prescribed holding period before the heat treatment, holding the semiconductor wafer separated from the susceptor during the pre-heating,
wherein
    the semiconductor wafer is an SOI wafer,
    the heat treatment furnace has a lift pin configured to move the semiconductor wafer upwardly and downwardly with respect to the susceptor, and the semiconductor wafer is separated from the susceptor by being supported by the lift pin,
    the temperature of the heat treatment is 1100° C. or more, and the temperature of the pre-heating is 700° C. or more and less than 1100° C.

2. The heat treatment method for a semiconductor wafer according to claim 1, wherein the heat treatment is performed in an atmosphere of hydrogen gas, argon gas, or a mixed gas thereof.

3. The heat treatment method for a semiconductor wafer according to claim 2, wherein the holding period in the pre-heating is 10 seconds or more and 90 seconds or less.

4. The heat treatment method for a semiconductor wafer according to claim 1, wherein the holding period in the pre-heating is 10 seconds or more and 90 seconds or less.

* * * * *